United States Patent
Kuo et al.

(10) Patent No.: US 9,831,303 B2
(45) Date of Patent: Nov. 28, 2017

(54) CAPACITOR STRUCTURE AND PROCESS FOR FABRICATING THE SAME

(71) Applicants: Chi-Hsiang Kuo, Taoyuan County (TW); Cheng-Shun Chen, Miaoli County (TW); Chang-Yao Hsieh, Changhua County (TW)

(72) Inventors: Chi-Hsiang Kuo, Taoyuan County (TW); Cheng-Shun Chen, Miaoli County (TW); Chang-Yao Hsieh, Changhua County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 37 days.

(21) Appl. No.: 13/666,984

(22) Filed: Nov. 2, 2012

(65) Prior Publication Data

US 2014/0126105 A1    May 8, 2014

(51) Int. Cl.
| | |
|---|---|
| *H01G 4/30* | (2006.01) |
| *H01G 4/232* | (2006.01) |
| *H01G 4/005* | (2006.01) |
| *H01L 29/94* | (2006.01) |
| *H01L 49/02* | (2006.01) |
| *H01L 27/108* | (2006.01) |

(52) U.S. Cl.
CPC ........ *H01L 28/90* (2013.01); *H01L 27/10852* (2013.01)

(58) Field of Classification Search
CPC . H01G 4/30; H01G 4/232; H01G 9/15; H01L 27/10852
USPC .............. 361/301.4, 303; 257/296, 306–308
See application file for complete search history.

(56) References Cited

U.S. PATENT DOCUMENTS

| | | | |
|---|---|---|---|
| 6,667,502 B1* | 12/2003 | Agarwal ................. | H01L 28/91 257/296 |
| 2005/0202645 A1* | 9/2005 | Kim ........................ | H01L 28/84 438/386 |
| 2006/0113575 A1* | 6/2006 | Jang et al. .................... | 257/296 |
| 2006/0124987 A1 | 6/2006 | Won et al. | |

(Continued)

FOREIGN PATENT DOCUMENTS

| | | |
|---|---|---|
| CN | 1667796 | 9/2005 |
| CN | 1967809 | 5/2007 |
| TW | 201015701 | 4/2010 |

OTHER PUBLICATIONS

"Office Action of Taiwan Counterpart Application", dated Nov. 12, 2014, p.1-p. 5.

(Continued)

*Primary Examiner* — Eric Thomas
*Assistant Examiner* — Arun Ramaswamy
(74) *Attorney, Agent, or Firm* — JCIPRNET

(57) ABSTRACT

A process for fabricating a capacitor is described. A template layer including a stack of at least one first layer and at least one second layer is formed over a substrate, wherein the at least one first layer and the at least one second layer have different etching selectivities and are arranged alternately. An opening is formed through the template layer. A wet etching process is performed to recess the at least one first layer relative to the at least one second layer, at the sidewall of the opening. A bottom electrode of the capacitor is formed at the bottom of the opening and on the sidewall of the opening, and then the template layer is removed.

9 Claims, 2 Drawing Sheets

(56) References Cited

U.S. PATENT DOCUMENTS

| | | | |
|---|---|---|---|
| 2006/0186452 A1* | 8/2006 | Nam | H01L 27/10852 |
| | | | 257/308 |
| 2007/0111434 A1 | 5/2007 | Ikeda | |
| 2008/0042182 A1* | 2/2008 | Park | H01L 27/10852 |
| | | | 257/306 |
| 2011/0203085 A1* | 8/2011 | Chen et al. | 29/25.42 |

OTHER PUBLICATIONS

"Office Action of China Counterpart Application", dated Dec. 4, 2015, p. 1-p. 9.
"Office Action of Taiwan Counterpart Application", dated Jan. 4, 2016, p. 1-p. 6.

* cited by examiner

CAPACITOR STRUCTURE AND PROCESS FOR FABRICATING THE SAME

BACKGROUND OF THE INVENTION

Field of Invention

This invention relates to a device in an integrate circuit and fabrication thereof, and particularly relates to a capacitor structure, especially a storage capacitor structure of DRAM, and to a process for fabricating the capacitor structure.

Description of Related Art

A conventional DRAM cell includes a transistor and a capacitor coupled thereto. In certain types of capacitor processes of DRAM, the lower electrodes of the capacitors of the memory cells are formed in straight-sidewall openings in a template layer, and then the template layer is entirely removed to maximize the exposed surface area of each lower electrode, thereby maximizing the capacitance of the capacitor formed later.

Because the integration degree of DRAM is raised gradually, the lateral area of each memory cell or each lower electrode is decreased gradually, and the height of each lower electrode has to be increased to maintain the capacitance of the capacitor beyond a certain level. Due to the increase in the aspect ratio, the straight-sidewall lower electrodes formed in the straight-sidewall openings in the template layer have lower mechanical strength, and are more easily damaged in the steps performed after the template layer is removed.

SUMMARY OF THE INVENTION

In view of the foregoing issues, this invention provides a process for fabricating a capacitor, which makes the capacitor less easily damaged.

This invention also provides a capacitor structure that is formed with the process of this invention.

The process for fabricating a capacitor of this invention is described as follows. A template layer including a stack of at least one first layer and at least one second layer is formed over a substrate, wherein the at least one first layer and the at least one second layer have different etching selectivities and are arranged alternately. An opening is formed through the template layer. A wet etching process is performed to recess the at least one first layer relative to the at least one second layer, at the sidewall of the opening. A bottom electrode of the capacitor is formed at the bottom of the opening and on the sidewall of the opening, and then the template layer is removed.

In an embodiment, the above process further includes, after the template layer is formed but before the opening is formed, forming a cap layer over the template layer, and forming, through the cap layer, a hole to which the opening will be aligned.

In an embodiment, the above process further includes: forming an etching stop layer over the substrate before the template layer is formed, and removing a portion of the etching stop layer exposed in the opening before the bottom electrode is formed.

The capacitor structure of this invention includes a bottom electrode, a top electrode, and a dielectric layer between the bottom electrode and the top electrode. The bottom electrode has a substantially vertical tube shape with a substantially uniform thickness, and includes at least one wider portion and a least one narrower portion that are arranged alternately in the vertical direction.

In an embodiment, the above capacitor structure further includes a cap layer around a top portion of the bottom electrode.

In an embodiment, the above capacitor structure further includes an etching stop layer around a bottom portion of the bottom electrode.

Since the at least one first layer at the sidewall of the opening for forming the lower electrode of the capacitor is recessed relative to the at least one second layer, the lower electrode has a larger surface area, and an uneven wall structure as well. Hence, the capacitance of the capacitor can be increased, and the mechanical strength of the lower electrode can be enhanced as well to reduce the possibility of damage in the steps performed after the template layer is removed.

In order to make the aforementioned and other objects, features and advantages of this invention comprehensible, a preferred embodiment accompanied with figures is described in detail below.

DESCRIPTION OF EMBODIMENTS

This invention is further explained with the following embodiments referring to the accompanying drawings, which are not intended to limit the scope of this invention. For example, although in the embodiment the hard mask layer for defining the openings for forming lower electrodes is defined by a patterned ashable hard mask (AHM) layer defined by a patterned photoresist layer with the corresponding opening patterns, the hard mask layer in this invention may alternatively be defined directly by such patterned photoresist layer.

Figure 1:
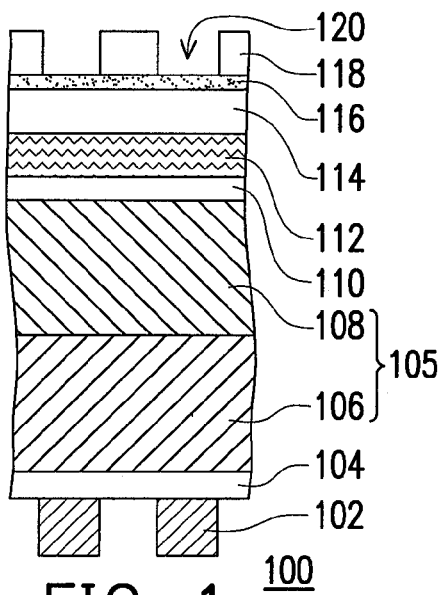
FIGS. 1-8 illustrate, in a cross-sectional view, a process for fabricating a capacitor according to an embodiment of this invention.
Figure 4:
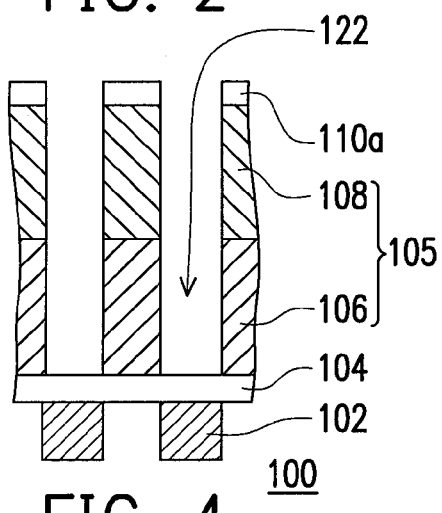
Figure 5:
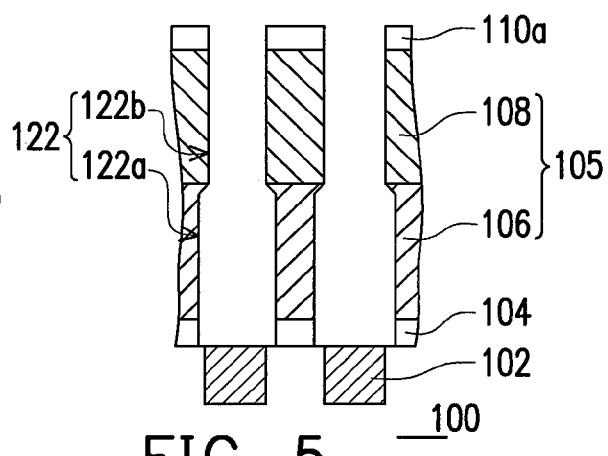
Figure 6:
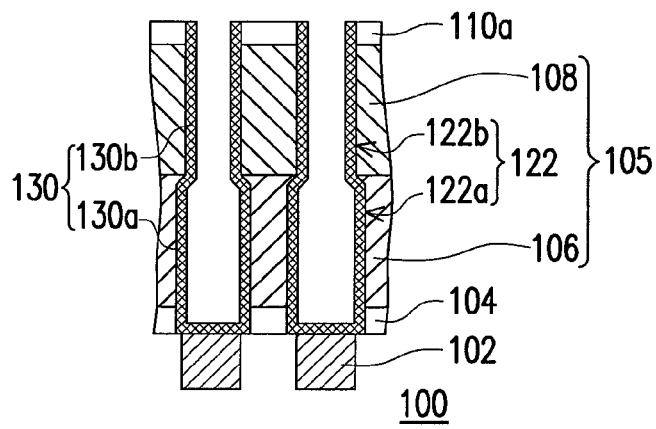

FIGS. 1-8 illustrate, in a cross-sectional view, a process for fabricating a capacitor according to an embodiment of this invention. Top views of the structures shown in FIGS. 1 and 6 are also provided in FIGS. 1A and 6A, respectively, for clarity, wherein FIGS. 1/6 is an I-I' cross-sectional view of the structure in FIGS. 1/6.

Figure 1A:
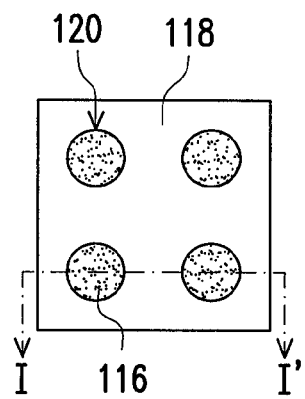
FIGS. 1A and 6A illustrate top views of the structures shown in FIGS. 1 and 6, respectively, wherein FIGS. 1/6 is an I-I' cross-sectional view of the structure in FIGS. 1/6.

Referring to FIGS. 1 and 1A, over a substrate 100 that has been formed with capacitor contacts 102 thereon, an etching stop layer 104, a template layer 105 including a stack of a first layer 106 and a second layer 108 on the first layer 106, a cap layer 110, a hard mask layer 112, a AHM layer 114, a dielectric anti-reflective coating (DARC) 116, and a patterned photoresist layer 118 having capacitor opening patterns 120 therein are formed in sequence.

When the substrate 100 is a substrate for fabricating DRAM, it usually has been formed with the access MOS transistors (not shown) of the memory cells of the DRAM beneath the level of the contacts 102. The etching stop layer 104 may include silicon nitride (SiN) or USG oxide, and may have a thickness of 50-300 angstroms.

The first layer 106 and the second layer 108 have different etching selectivities, wherein the first layer 106 has a higher etching rate than the second layer 108 in certain etchant used in a wet etching process. The etching selectivity ratio of the first layer 106 to the second layer 108 may range from 1.5 to 5.0. Within the range of etching selectivity ratio, it is possible that the first layer 106 includes doped poly-Si and the second layer 108 includes undoped poly-Si. For example, in a solution of $NH_4OH$ or tetramethylammonium hydroxide (TMAH) as a wet etchant, the etching selectivity ratio of doped poly-Si to undoped poly-Si ranges from 1.5 to 5.0. The wet-etching selectivity of $NH_4OH$ or TMAH between doped (106) and undoped (108) poly-Si is dependent on the doping species, e.g., with a higher etching rate for Ar, Si, As or P, or a lower etching rate for B. This factor is a variable for a different profile and shape of the container of each capacitor.

The cap layer 110 may include SiN, and may have a thickness of 800 angstroms. The hard mask layer 112 may include TEOS or BSG oxide, and may have a thickness of 6000-8000 angstroms. The AHM layer 114 may include transparent carbon or amorphous carbon, and may have a thickness of 6000-8000 angstroms. The DARC 116 may have a thickness of 260-750 angstroms. All of the above thicknesses depend on the total stack height of the capacitor and the dry etch requirement.

Figure 2:
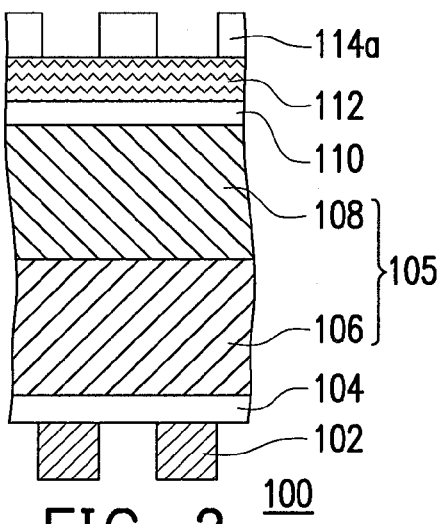

Referring to FIGS. 1-2, the AHM layer 114 is etched and patterned using the patterned photoresist layer 118 as a mask, wherein the patterned photoresist layer 118 and the DARC 116 are consumed when the patterning is finished. The patterned AHM layer 114a serves as a mask for defining the hard mask layer 112, resulting in an effect of etching high aspect-ratio features as compared to a case where the hard mask layer is directly defined by a similar patterned photoresist layer.

Figure 3:
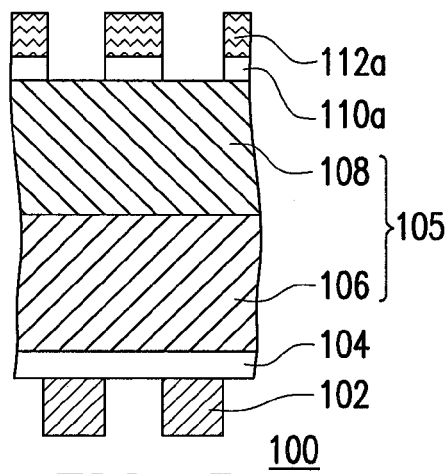

Referring to FIGS. 2-3, the hard mask layer 112 and the cap layer 110 are etched and patterned using the patterned AHM layer 114a as a mask, wherein the patterned AHM layer 114a is consumed when the patterning is finished.

Referring to FIGS. 3-4, the template layer 105 including the second layer 108 and the first layer 106 is anisotropically etched and patterned using the patterned hard mask layer 112a as a mask to form openings 122 therein, wherein the patterned hard mask layer 112a is partially consumed when the patterning is finished.

Referring to FIG. 5, a wet etching process is performed to recess the first layer 106 relative to the second layer 108, at the sidewall of each opening 122, so that a wider portion 122a of the opening 122 is created in the first layer 106 while the portion of the opening 122 in the second layer 108 remains to be a relatively narrower portion 122b. When the first layer 106 includes doped poly-Si and the second layer 108 includes undoped poly-Si, the etchant suitably used in the wet etching process may be $NH_4OH$ or TMAH. Thereafter, the residue of the hard mask 112a and the exposed portions of the etching stop layer 104 are removed to expose the top surface of the patterned cap layer 110a and the capacitor contacts 102, respectively.

Referring to FIG. 6, a lower electrode 130 of a capacitor is then formed at the bottom of each opening 122 and on the sidewall of the same, having a substantially vertical tube shape with a substantially uniform thickness and with a closed bottom end and an open top end, and including a wider portion 130a in the wider portion 122a of the opening 122 and a relatively narrower portion 130b in the narrower portion 122b of the opening 122. The lower electrodes 130 can be formed by depositing a thin conductive layer, filling up the openings 122 with a filling material, removing the thin conductive layer outside of the openings 122 and then remove the filling material. The lower electrodes 130 may include a metallic material, such as titanium nitride (TiN) or ruthenium (Ru). Then, as shown in the top view of FIG. 6A where the line I-I' corresponds to FIG. 6, an opening 134 is formed in the patterned cap layer 110a to expose a portion of the second layer 108 for the later removal process.

Figure 6A:
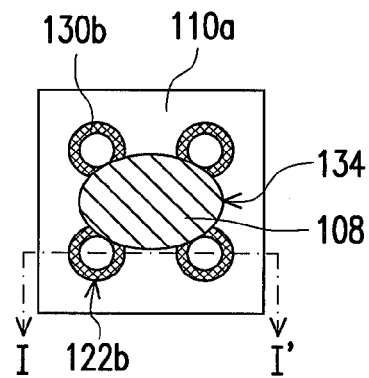
Figure 7:
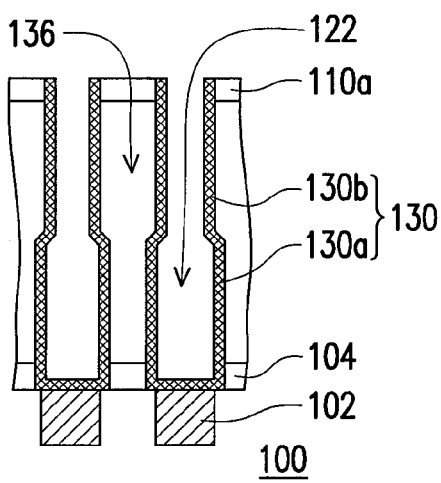

Referring to FIGS. 6A and 7, another wet etching process is performed to remove the second layer 108 and the first layer 106 between the lower electrodes 130 through the opening 134 (FIG. 6A), leaving a hollow 136 defined by the etching stop layer 104, the patterned cap layer 110a, and the outer surfaces of the lower electrodes 130. When the first layer 106 includes doped poly-Si and the second layer 108 includes undoped poly-Si, the etchant used in the another wet etching process may be $NH_4OH$ or TMAH.

As shown in FIG. 7, since each lower electrode 130 has an uneven wall structure constituted by the narrower portion 130b and the wider portion 130a with substantially the same thickness, its mechanical strength is enhanced. Hence, the lower electrodes 130 are less easily damaged in the steps performed after the template layer 105 is removed.

Figure 8:
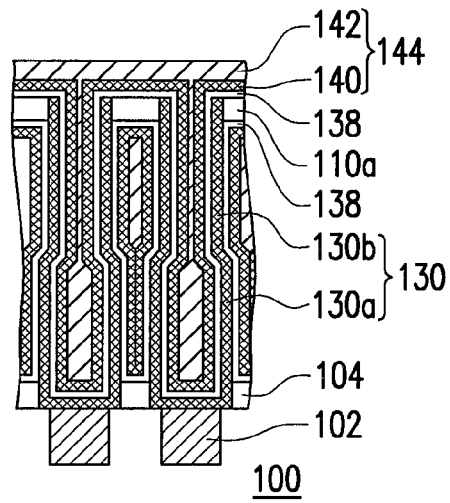

Referring to FIG. 8, a capacitor dielectric layer 138 is then formed covering the inner surface and the outer surface of each bottom electrode 130. The dielectric layer 138 may includes a high-K material, such as $ZrO_x$. A metallic layer 140, such as a layer of TiN or Ru, is formed covering the dielectric layer 138, and then a doped poly-Si layer 142 is formed covering the metallic layer 140 and filling up the openings 122 and the hollow 136. The metallic layer 140 and the doped poly-Si layer 142 constitute a common top electrode 144 of the capacitors.

As shown in FIGS. 7-8, since the lower electrode 130 of each capacitor has a wider portion 130a as compared to the conventional lower electrode, the surface area of the lower electrode 130 is larger, so that the capacitance of the capacitor is larger.

Figure 9:
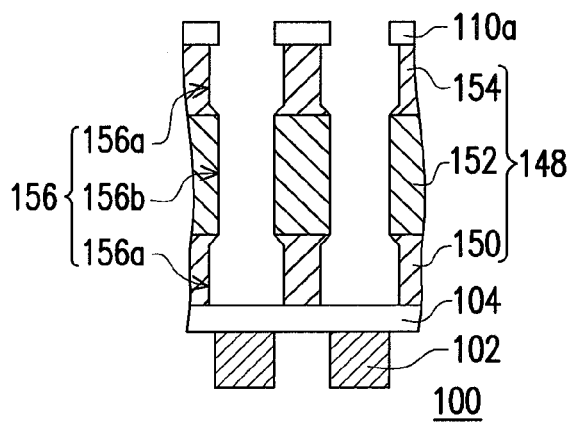
FIGS. 9 and 10 illustrate different structures of the template layer according to two other embodiments of this invention.
Figure 10:
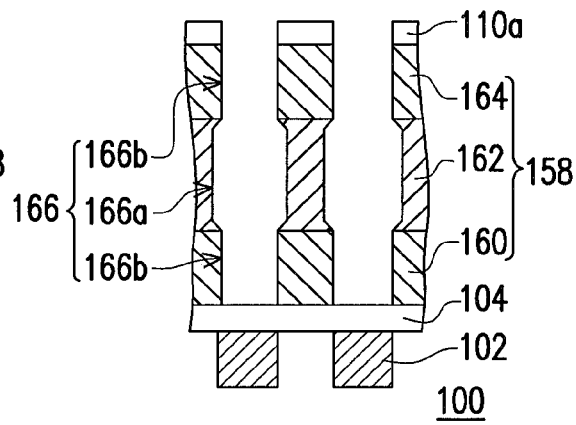

In addition, though the template layer 105 in the above embodiment includes a stack of a first layer 106 with a relatively higher etching selectivity and a second layer 108 with a relatively lower etching selectivity, the template layer of this invention is not limited to the structure. In general, the template layer of this invention may include at least one first layer with a relatively higher etching selectivity and at least one second layer with a relatively lower etching selectivity that are arranged alternately. FIGS. 9 and 10 illustrate the template layer structures of such two embodiments.

Referring to FIG. 9, in this embodiment, the template layer 148 includes two layers 150 and 154 with a relatively higher etching selectivity, and one layer 152 with a relatively lower etching selectivity between the two layers 150 and 154, wherein the former is recessed relative to the latter by the etchant used in the wet etching process. Accordingly, the lower electrode later formed in each opening in the template layer 148 includes two wider portions in the two layers 150 and 154 and one narrower portion in the layer 152.

Referring to FIG. 10, in this embodiment, the template layer 158 includes two layers 160 and 164 with a relatively lower etching selectivity, and one layer 162 with a relatively higher etching selectivity between the two layers 160 and 164, wherein the latter is recessed relative to the former by the etchant used in the wet etching process. Accordingly, the lower electrode later formed in each opening in the template layer 158 includes two narrower portions in the two layers 160 and 164 and one wider portion in the layer 162.

In the above two embodiments, the lower electrode of each capacitor, which is formed based on the template layer 148 or 158, also has at least one wider portion as compared to the conventional lower electrode, and also has an uneven wall structure. As a result, the capacitance of each capacitor can be increased, and the mechanical strength of the lower electrode of each capacitor can be enhanced as well to reduce the possibility of damage in the steps performed after the template layer is removed.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A capacitor structure, comprising:
   a substrate;
   a bottom electrode, disposed on the substrate and having a substantially perpendicular tube shape with a substantially uniform thickness, and comprising at least one first wider portion and at least one first narrower portion that are arranged alternately in a perpendicular direction, wherein the at least one first wider portion and the at least one first narrower portion are connected by a slant portion and the at least one first wider portion is located below the at least one first narrower portion, wherein sidewalls of the at least one first wider portion and the at least one first narrower portion are perpendicular with respect to a top surface of the substrate;
   a top electrode;
   a dielectric layer between the bottom electrode and the top electrode, wherein the dielectric layer is in direct contact with the at least one first wider portion and the at least one first narrower portion of the bottom electrode; and
   a cap layer, surrounding a topmost portion of the bottom electrode, so that a topmost surface of the bottom electrode is coplanar with a top surface of the cap layer, wherein the top electrode covers the top surface, a bottom surface and sidewalls of the cap layer, and the dielectric layer is in direct contact with the top surface and the bottom surface of the cap layer, wherein a thickness of the cap layer is less than a length of the at least one first narrower portion perpendicular with respect to the top surface of the substrate.

2. The capacitor structure of claim 1, further comprising an etching stop layer around a bottom portion of the bottom electrode.

3. The capacitor structure of claim 1, wherein the dielectric layer and the top electrode cover an inner surface and an outer surface of the bottom electrode.

4. The capacitor structure of claim 1, wherein the bottom electrode comprises TiN or Ru.

5. The capacitor structure of claim 1, wherein the dielectric layer comprises a high-K material.

6. The capacitor structure of claim 1, wherein the top electrode comprises a TiN layer covering the dielectric layer, and a poly-Si layer covering the TiN layer.

7. A capacitor structure, comprising:
   a substrate;
   a bottom electrode, disposed on the substrate and comprising a side portion and a bottom portion, wherein the side portion has a substantially perpendicular tube shape with a substantially uniform thickness and comprises at least one first wider portion and at least one first narrower portion that are arranged alternately in a perpendicular direction, in which a width of an opening of the at least one first wider portion is greater than a width of an opening of the at least one first narrower portion and the at least one first wider portion is located below the at least one first narrower portion, wherein sidewalls of the at least one first wider portion and the at least one first narrower portion are perpendicular with respect to a top surface of the substrate;
   a top electrode;
   a dielectric layer between the bottom electrode and the top electrode; and
   a cap layer, surrounding a topmost portion of the bottom electrode, so that a topmost surface of the bottom electrode is coplanar with a top surface of the cap layer, wherein the top electrode covers the top surface, a bottom surface and sidewalls of the cap layer, and the dielectric layer is in direct contact with the top surface and the bottom surface of the cap layer, wherein a thickness of the cap layer is less than a length of the at least one first narrower portion perpendicular with respect to the top surface of the substrate.

8. The capacitor structure of claim 1, further comprising at least one second wider portion located above the at least one first narrower portion.

9. The capacitor structure of claim 1, further comprising at least one second narrower portion located below the at least one first wider portion.

* * * * *